United States Patent
Wada et al.

(10) Patent No.: US 6,602,734 B1
(45) Date of Patent: Aug. 5, 2003

(54) METHOD OF MANUFACTURING A SEMICONDUCTOR DEVICE

(75) Inventors: Tsutomu Wada, Higashiyamato (JP); Masachika Masuda, Tokorozawa (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 279 days.

(21) Appl. No.: 09/692,467

(22) Filed: Oct. 20, 2000

(30) Foreign Application Priority Data

Nov. 29, 1999 (JP) .......................... 11-338657

(51) Int. Cl.⁷ .............................. H01L 21/44
(52) U.S. Cl. .................. 438/110; 438/112; 438/124; 438/125; 438/126; 438/127; 438/458; 438/459; 438/460; 438/462
(58) Field of Search ............................ 438/110, 112, 438/124–127, 458–460, 462

(56) References Cited

U.S. PATENT DOCUMENTS 5,478,007 A * 12/1995 Marrs .................. 228/180.22
6,159,770 A * 12/2000 Tetaka et al. ............... 438/112
6,315,540 B1 * 11/2001 Tsuruta ....................... 425/123

FOREIGN PATENT DOCUMENTS

JP        11-214588         8/1999

* cited by examiner

Primary Examiner—John F. Niebling
Assistant Examiner—Lynne A. Gurley
(74) Attorney, Agent, or Firm—Mattingly, Stanger & Malur, P.C.

(57) ABSTRACT

For the manufacturing of semiconductor devices, in which multiple semiconductor chips which are mounted on a wiring substrate are processed for block molding and thereafter the wiring substrate is diced into individual resin-molded semiconductor devices, disclosed herein is a technique for easily determining the position of each resin-molded semiconductor device in its former state on the wiring substrate even after the dicing process. The processing steps include implementing the block molding with resin for multiple semiconductor chips mounted on a wiring substrate and thereafter dicing the wiring substrate into individual resin-molded semiconductor devices, with the substrate dicing step being preceded by a step of appending an address information pattern to each of the resin-molded semiconductor devices.

10 Claims, 21 Drawing Sheets

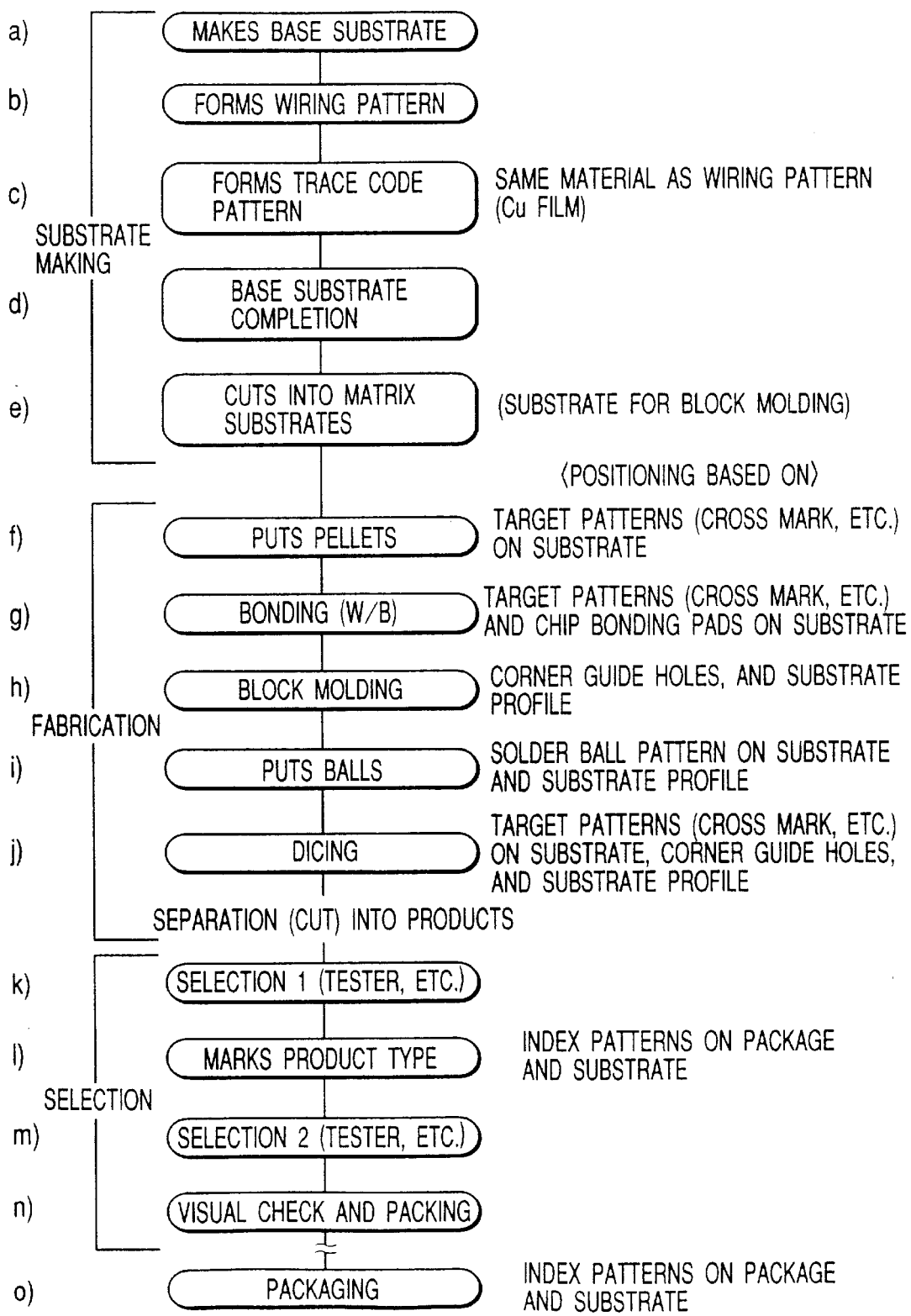

METHOD OF MANUFACTURING A SEMICONDUCTOR DEVICE

BACKGROUND OF THE INVENTION

The present invention relates to the technology of the manufacturing of semiconductor devices, and particularly to a technique which is useful for the manufacturing of semiconductor devices of the resin mold type in which multiple semiconductor chips mounted on a wiring substrate are processed for block molding and thereafter the wiring substrate is diced into individual semiconductor devices.

Japanese Patent Unexamined Publication No. Hei 11(1999)-214588 describes a method of manufacturing semiconductor devices of the resin mold type in which multiple semiconductor chips mounted on a TAB tape are molded with resin and thereafter the resin and TAB tape are cut into individual semiconductor devices.

The above-mentioned patent publication also discloses a technique for preventing the displacement of the cutting position of the resin and TAB tape based on the accurate observation of the cutting position which is displayed in terms of the reflected light from part of copper wire patterns formed in the periphery of the land section of the resin-molded tape.

SUMMARY OF THE INVENTION

The inventors of the present invention are developing a technique for manufacturing semiconductor devices of the resin mold type in which multiple semiconductor chips which are mounted in a matrix arrangement on a wiring substrate are processed for block molding and thereafter the wiring substrate is diced into individual semiconductor devices.

In adopting this manufacturing method, it is necessary to know easily, even after the dicing process, the position of each finished resin-molded semiconductor device in its former state on the wiring substrate in order to conduct the prompt analysis of faulty products resulting from a process and find out the defective position.

A conceivable manner, for example, is to form marks of address information on the injector pin or the like of the molding die which is used for molding semiconductor chips with resin so that distinct address information is appended to the area of each resin-molded semiconductor device at the block molding of semiconductor chips on the wiring substrate.

However, this manner necessitates an awkward work of forming on the molding die different patterns of address information for each type of product, and it is not applicable to the case of using standard (existing) molding dies of clients.

It is an object of the present invention to provide for the manufacturing of semiconductor devices of the resin mold type, in which multiple semiconductor chips which are mounted on a wiring substrate are processed for block molding and thereafter the wiring substrate is diced into multiple semiconductor devices, a technique for finding out easily, even after the dicing process, the position of each resin-molded semiconductor device in its former state on the wiring substrate.

These and other objects and novel features of the present invention will become apparent from the following description of specification taken in conjunction with the accompanying drawings.

Among the affairs of the present invention disclosed in this specification, representatives are summarized as follows.

The inventive method of manufacturing semiconductor devices includes processing steps of implementing the block molding with resin for a plurality of semiconductor chips which are mounted on a wiring substrate and thereafter dicing the wiring substrate into a plurality of resin-molded semiconductor devices, with the substrate dicing step being preceded by a step of appending address information to each of the resin-molded semiconductor devices.

The inventive method of manufacturing semiconductor devices includes processing steps of implementing the block molding with resin for a plurality of semiconductor chips which are mounted on a wiring substrate and thereafter dicing the wiring substrate into a plurality of resin-molded semiconductor devices, with the substrate dicing step being preceded by a step of appending address information of each of the resin-molded semiconductor devices to part of the wiring substrate.

The inventive method of manufacturing semiconductor devices includes processing steps of implementing the block molding with resin for a plurality of semiconductor chips which are mounted on a wiring substrate and thereafter dicing the wiring substrate into a plurality of resin-molded semiconductor devices, with the substrate dicing step being preceded by a step of appending address information of each of the resin-molded semiconductor devices to part of the resin mold corresponding to the individual resin-molded semiconductor devices.

The inventive method of manufacturing semiconductor devices includes processing steps of dividing semiconductor chips which are mounted on a wiring substrate into blocks and molding the chips with resin and thereafter dicing each of the blocks into a plurality of resin-molded semiconductor devices.

BRIEF DESCRIPTION OF THE DRAWINGS

FIG. 17 is a flowchart showing the manufacturing method of resin-molded semiconductor devices based on embodiment 1 of this invention;

DESCRIPTION OF THE PREFERRED EMBODIMENTS

Embodiments of this invention will be explained in detail with reference to the drawings. Throughout the drawings which explain the embodiments, identical parts are referred to by the same symbols, and their explanation will not be repeated.

Embodiment 1

Figure 1:
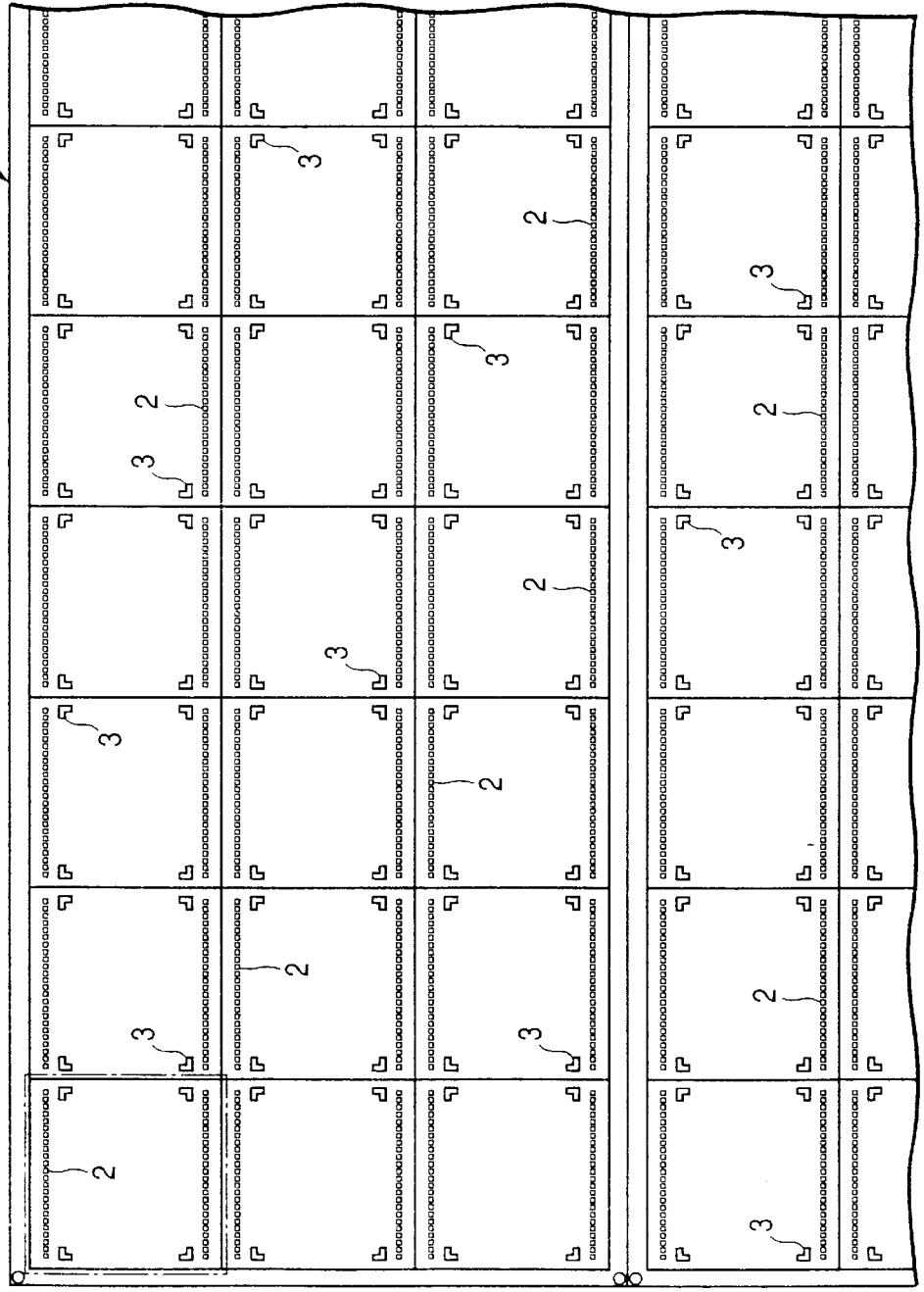
FIG. 1 is an enlarged plan view showing part of the matrix substrate (upper side) used for the manufacturing of resin-molded semiconductor devices based on embodiment 1 of this invention.
Figure 2:
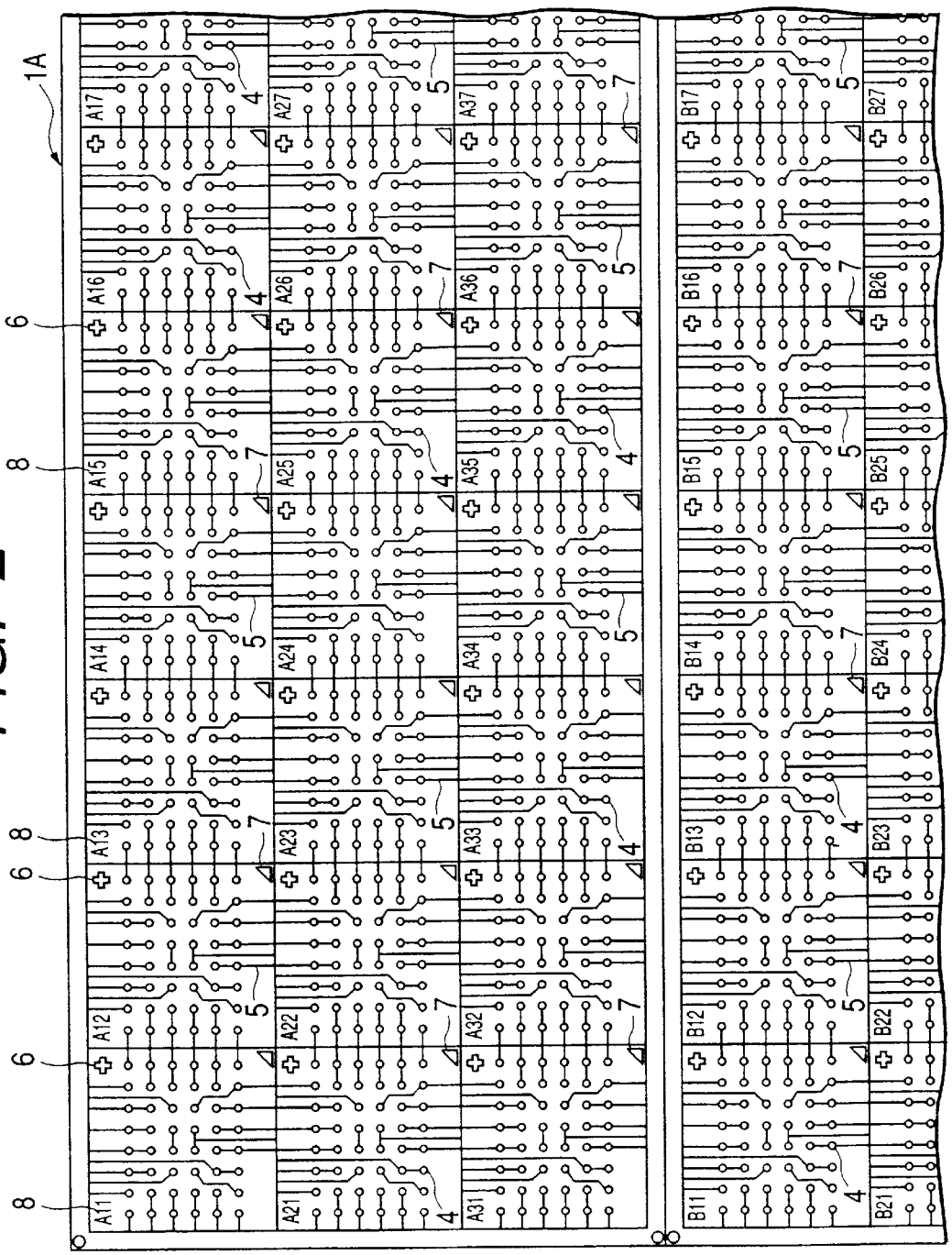
FIG. 2 is an enlarged plan view showing part of the matrix substrate (rear side) used for the manufacturing of resin-molded semiconductor devices based on embodiment 1 of this invention.

FIG. 1 and FIG. 2 show part of the matrix substrate which is used for the manufacturing of resin-molded semiconductor devices based on this embodiment. FIG. 1 shows the chip mounting surface (upper side), and FIG. 2 shows the packaging surface (rear side).

The matrix substrate 1A is a thin wiring substrate of resin having dimensions of 500 mm by 500 mm and 0.22 to 0.6 mm in thickness, for example, on the upper side of which are mounted a plurality of semiconductor chips in a matrix arrangement in the pellet putting process which will be explained later. The matrix substrate 1A is made of a known material for wiring substrates, e.g., glass epoxy resin, BT resin or polyamide resin, and particularly it can be made of such an inexpensive material for wiring substrates as glass epoxy resin thereby to lower the manufacturing cost of resin-molded semiconductor devices. The matrix substrate 1A can also be made of a wiring substrate having flexibility such as a flexible printed circuit (FPC) for example.

As shown in FIG. 1, the matrix substrate 1A has on its upper side the formation of pads 2, alignment targets 3 which guide the positioning of semiconductor chips on the matrix substrate 1A in the pellet putting process which will be explained later, and wire patterns (not shown) which are connected electrically with the pads 2.

As shown in FIG. 2, the matrix substrate 1A has on its rear side the formation of pads 4 which are to be connected with solder bumps in the ball bonding process which will be explained later, wire patterns 5 formed integrally with the pads 4, alignment targets 6 which guide the positioning at the connection of the solder bumps to the pads 4, index patterns 7 which orients the resin-molded semiconductor devices on the circuit board at packaging, and address information patterns 8 which indicate the address information of individual resin-molded semiconductor devices.

Figure 3A:
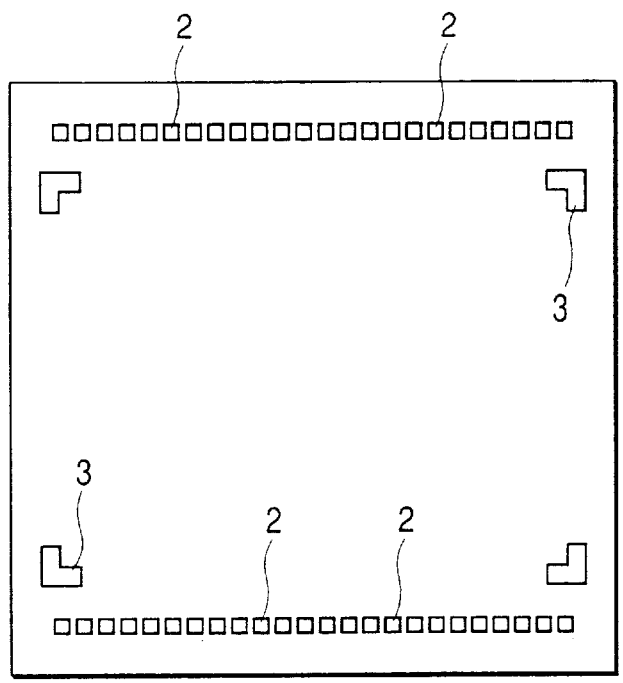
FIGS. 3(a) and 3(b) are enlarged plan views showing the upper side and rear side, respectively, of an area of the matrix substrate for one resin-molded semiconductor device.

FIG. 3(a) shows a rectangular area on the upper side of the matrix substrate 1A enclosed by the dash-dot line in FIG. 1, i.e., the area for one resin-molded semiconductor device, and it has dimensions of 6.4 to 6.6 mm by 6.4 to 6.6 mm for example. The pads 2, alignment targets 3 and wire patterns (not shown) are formed by the etching process of an electrolytic copper foil (or pressed copper foil) of around 20 $\mu$m in thickness stuck on the upper side of the matrix substrate 1A. The pads 2 and alignment targets 3 having a unit pattern shown in FIG. 3(a) are formed repeatedly in the longitudinal and lateral directions on the matrix substrate 1A. Wire patterns (not shown) are arranged in the same fashion.

Figure 3B:
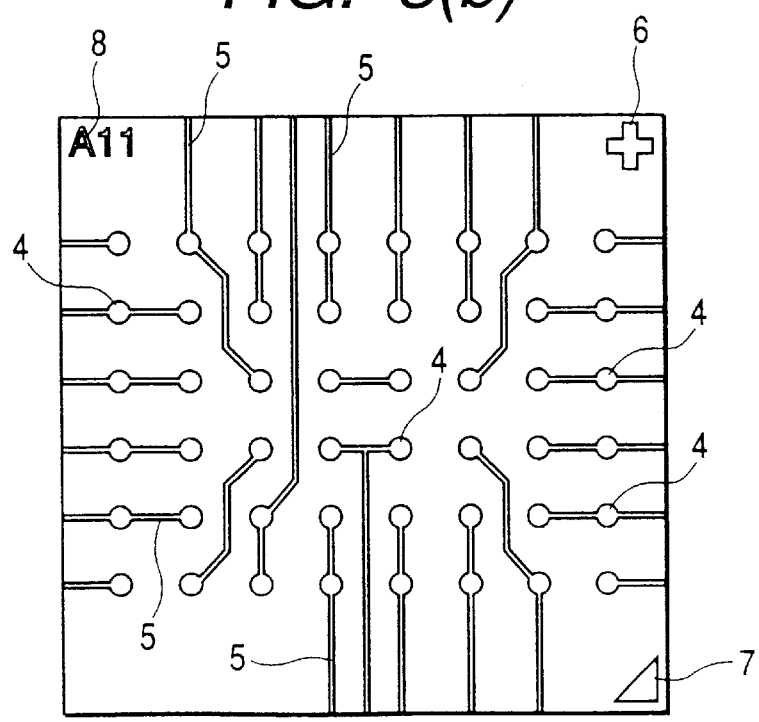

FIG. 3(b) shows an area on the rear side of the matrix substrate 1A for one resin-molded semiconductor device. The pads 4, wire patterns 5, alignment target 6, index pattern 7, and address information pattern 8 are formed by the etching process for an electrolytic copper foil (or pressed copper foil) of around 20 $\mu$m in thickness stuck on the rear side of the matrix substrate 1A. These patterns, except for the address information pattern 8, having a unit pattern shown in FIG. 3(b) are formed repeatedly in the longitudinal and lateral directions on the matrix substrate 1A. The pads 4 and wire pattern 5 are connected electrically to the pads 2 on the upper side by through-holes (not shown) formed in the matrix substrate 1A.

The number of pads 4 formed in the area of one resin-molded semiconductor device is 6 by 8 in the longitudinal and lateral directions, i.e.,48, for example. The pads 4 have an interval of alignment of 0.75 mm in the longitudinal and lateral directions for example. The alignment target 6 and index pattern 7 shown in the figure have a cross and triangular shapes, respectively, for example.

Figure 4:
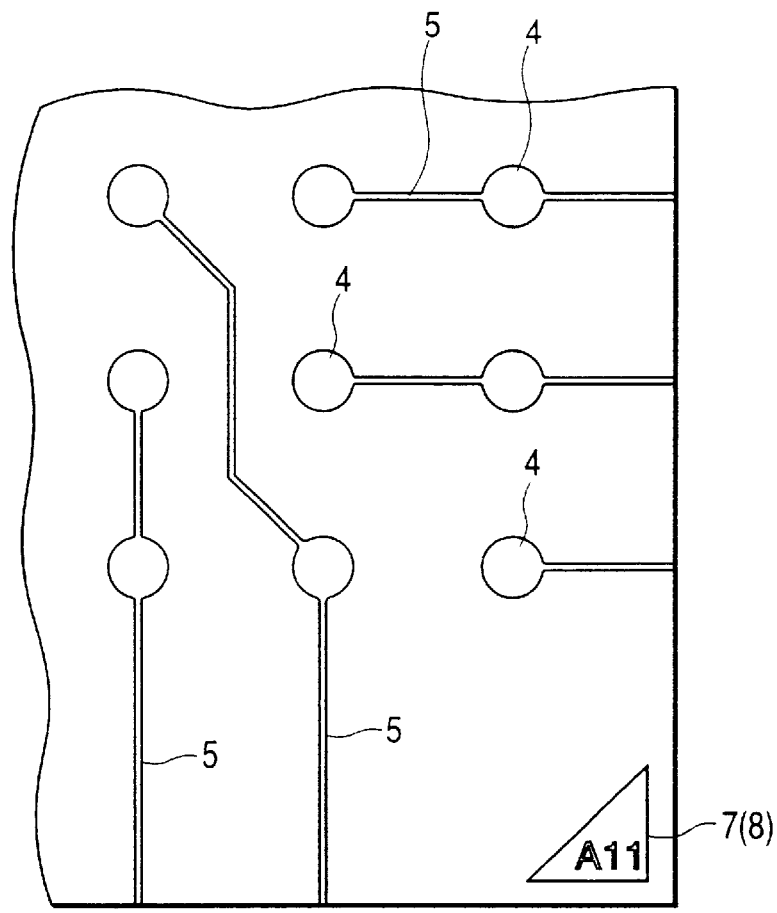
FIG. 4 is an enlarged plan view showing part of the matrix substrate (rear side) used for the manufacturing of resin-molded semiconductor devices based on embodiment 1 of this invention.

The address information pattern 8 contains information indicative of the position of the resin-molded semiconductor device within the matrix substrate 1A. Specifically, areas of individual semiconductor devices have patterns of are A11, A12, . . . , A21, A22, . . . , and so on. The alignment target 6, index pattern 7 and address information pattern 8 located at separate positions in the example shown in the figure can be unified and located at one position to have these roles at once. For example, FIG. 4 shows an example of the unified pattern which combines the index pattern 7 and address information pattern 8. In this case, the unified pattern has a shape (rectangular pattern) of index pattern 7 which is common to each area of one resin-molded semiconductor device and has a pattern section (character pattern) of address information pattern 8 which is different among the areas.

The address information pattern 8, which is a 3-digit character pattern such as A11, A12, . . . , A21, A22, . . . , and so on in the example shown in the figure, can be arbitrary provided that it is unique to each area of one resin-molded semiconductor device. The address information pattern 8 may contain information other than the chip location of the foregoing case, e.g., it may contain the production lot or the type number of the molding die which is used in the molding process which will be explained later.

Figure 5:
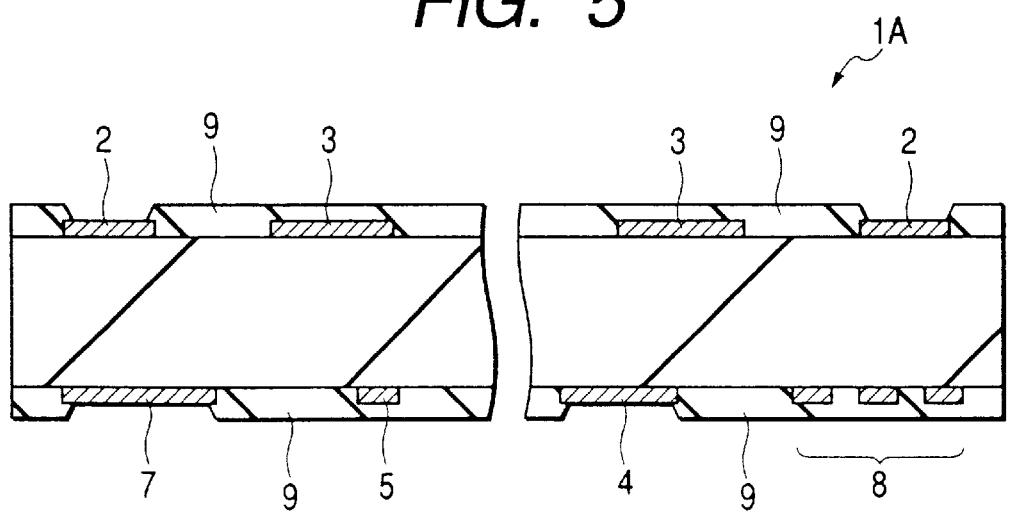
FIG. 5 is an enlarged cross-sectional view showing part of the matrix substrate used for the manufacturing of resin-molded semiconductor devices based on embodiment 1 of this invention.

FIG. 5 shows the cross section of part of the matrix substrate 1A. The matrix substrate 1A is coated on both sides thereof with known thin solder resist 9 of epoxy resin or the like having a thickness of around several tens micro-meters for example so as to prevent short-circuiting between wire patterns 5 by solder. Among the above-mentioned various kinds of patterns, the pads 2 and 4 and index pattern 7 are cleared of the solder resist 9 on their surfaces and rendered the Au plating or the like when necessary. The address information pattern 8 has its surface coated with or cleared of the solder resist 9 depending on the means of reading the pattern 8 (camera, microscope, etc.).

Next, the method of manufacturing resin-molded semiconductor devices based on the foregoing matrix substrate 1A will be explained by following the processing steps in connection with FIG. 6 through FIG. 16.

Figure 6:
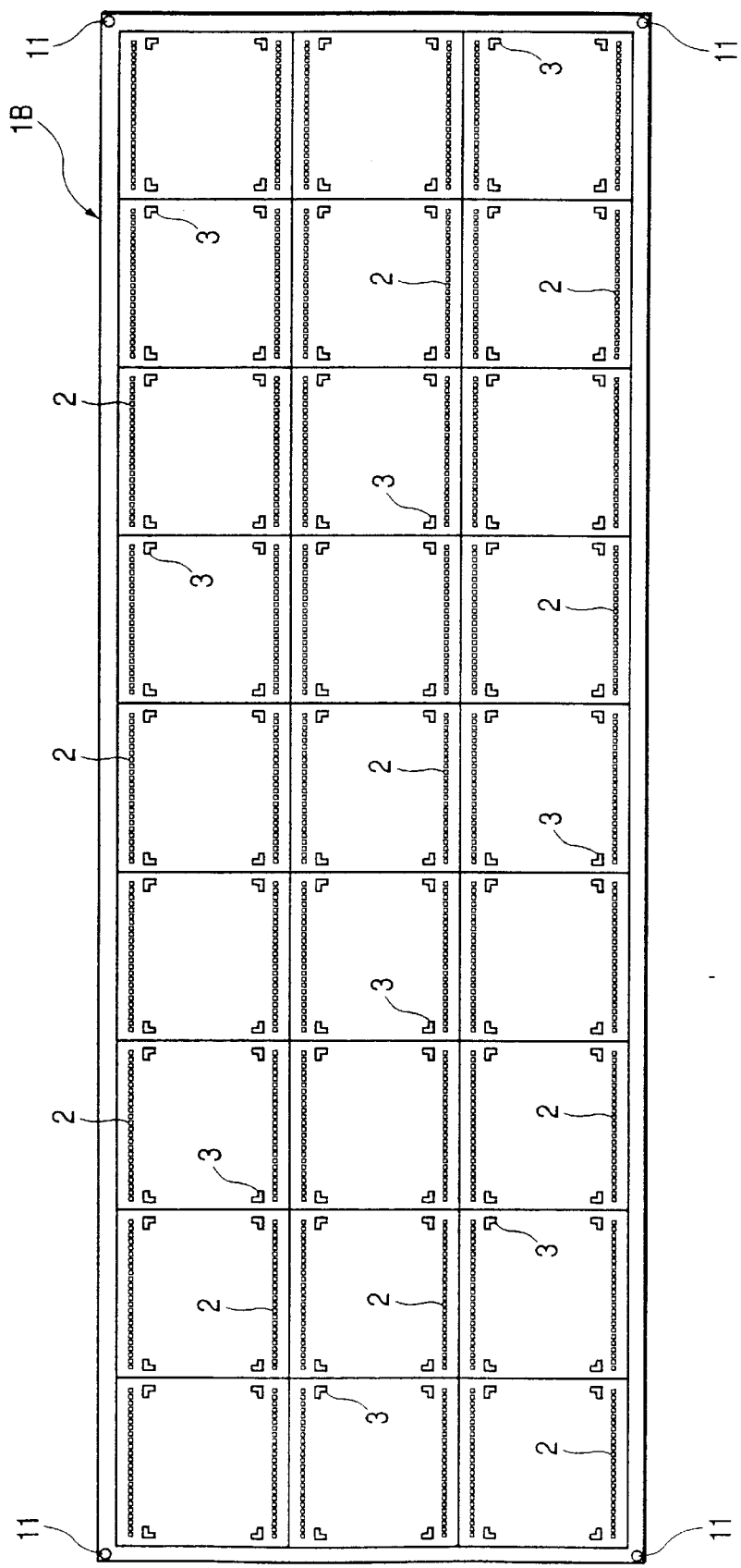
FIG. 6 is a plan view of the matrix substrate (upper side) showing the manufacturing method of resin-molded semiconductor devices based on embodiment 1 of this invention.
Figure 7:
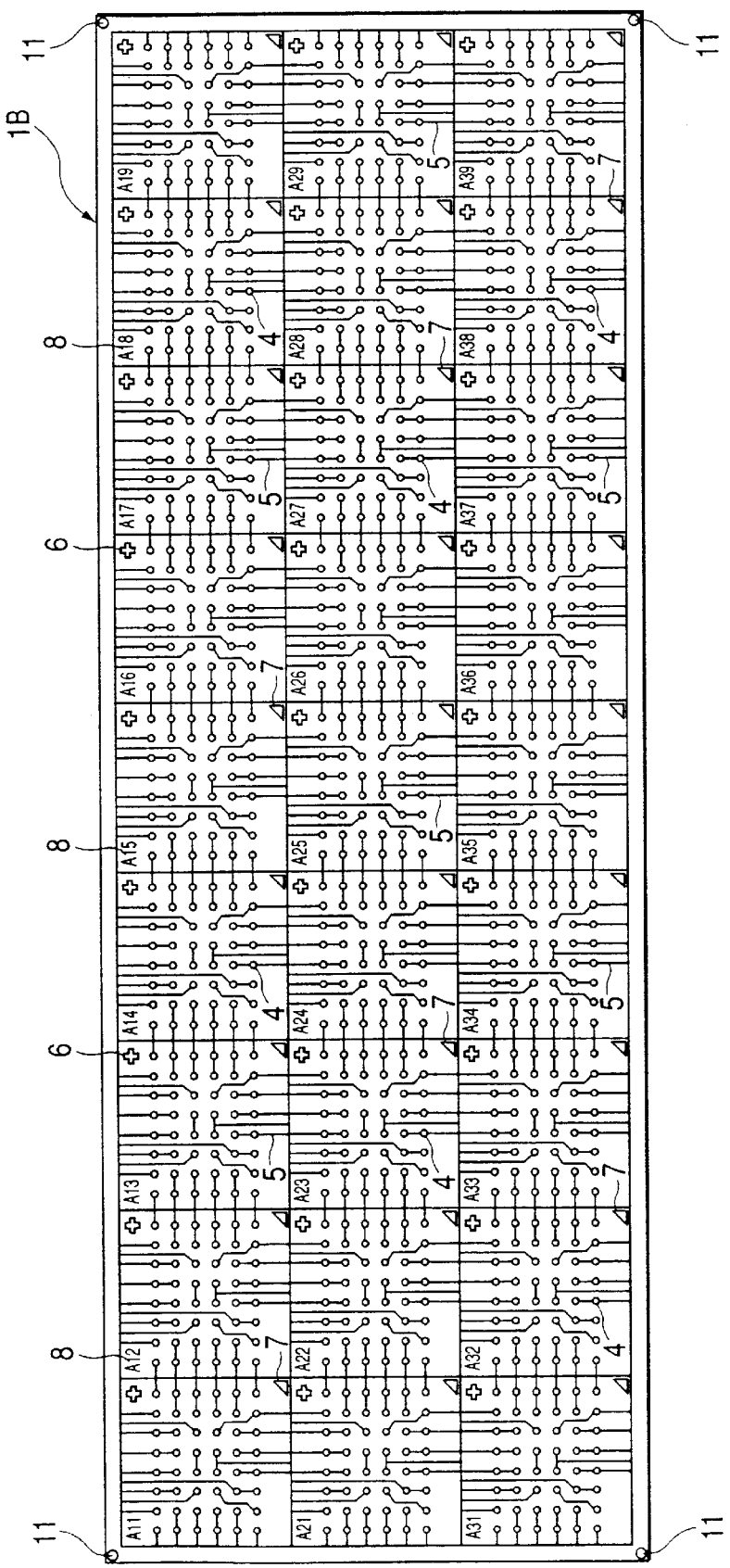
FIG. 7 is a plan view of the matrix substrate (rear side) showing the manufacturing method of resin-molded semiconductor devices based on embodiment 1 of this invention.

Initially, the matrix substrate 1A is cut into segments to get matrix substrates 1B for molding as shown in FIG. 6 and FIG. 7. This matrix substrate 1B has a longitudinal and lateral dimensions of around 30 to 70 mm by 150 to 230 mm for example. The matrix substrate 1B for molding has its dimensions determined from the dimensions of the molding die used in the molding process, and therefore this cut-dividing process is not needed when the matrix substrate 1A has been made in accordance with the dimensions of the molding die. The matrix substrate 1A is cut with a known dicing machine (dicer) which is designed to cut resin wiring substrates. The matrix substrate 1B is punched at its four corners to have the formation of guide holes 11 which are used for the positioning when it is loaded to the die in the molding process.

Figure 8:
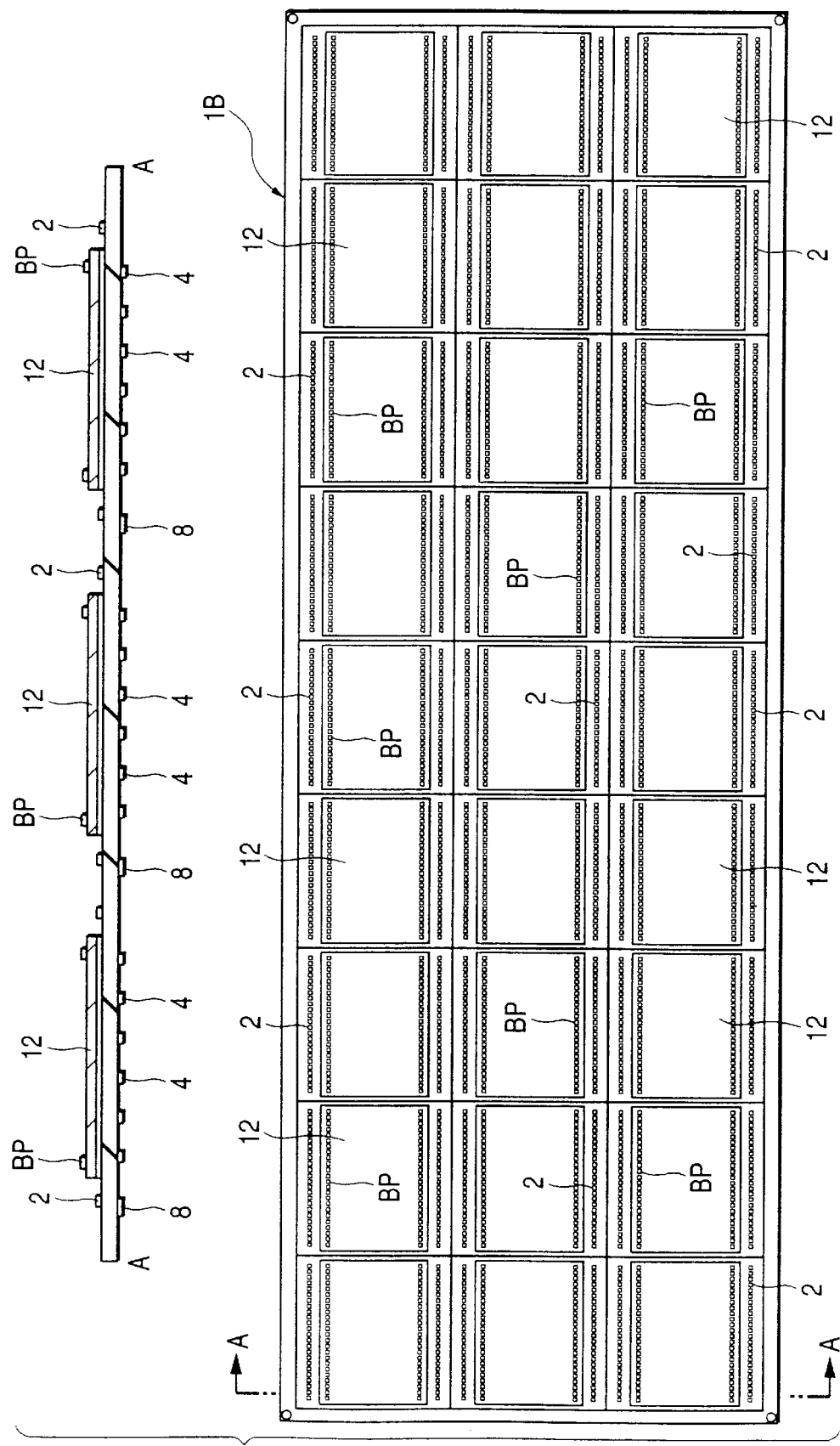
FIG. 8 is a plan view and brief cross-sectional view of the matrix substrate showing the manufacturing method of resin-molded semiconductor devices based on embodiment 1 of this invention.

Next, as shown in FIG. 8, semiconductor chips (will be termed simply "chips" hereinafter) 12 are mounted on the upper surface of the matrix substrate 1B. The chip 12 has on its major surface the formation of memory LSI such as SRAM (Static Random Access Memory), and it is a monocrystalline silicon chip having a longitudinal and lateral dimensions of around 4.5 to 5.0 mm by 5.5 to 6.0 mm, with bonding pads BP being formed on the two confronting sides. In mounting the chip 12 on the matrix substrate 1B, it is positioned accurately based on the observation of the alignment targets 3 with a camera or the like. The chip 12 is stuck to the matrix substrate 1B with the known glue of acrylic-epoxy resin, Ag paste, or the like.

Figure 9:
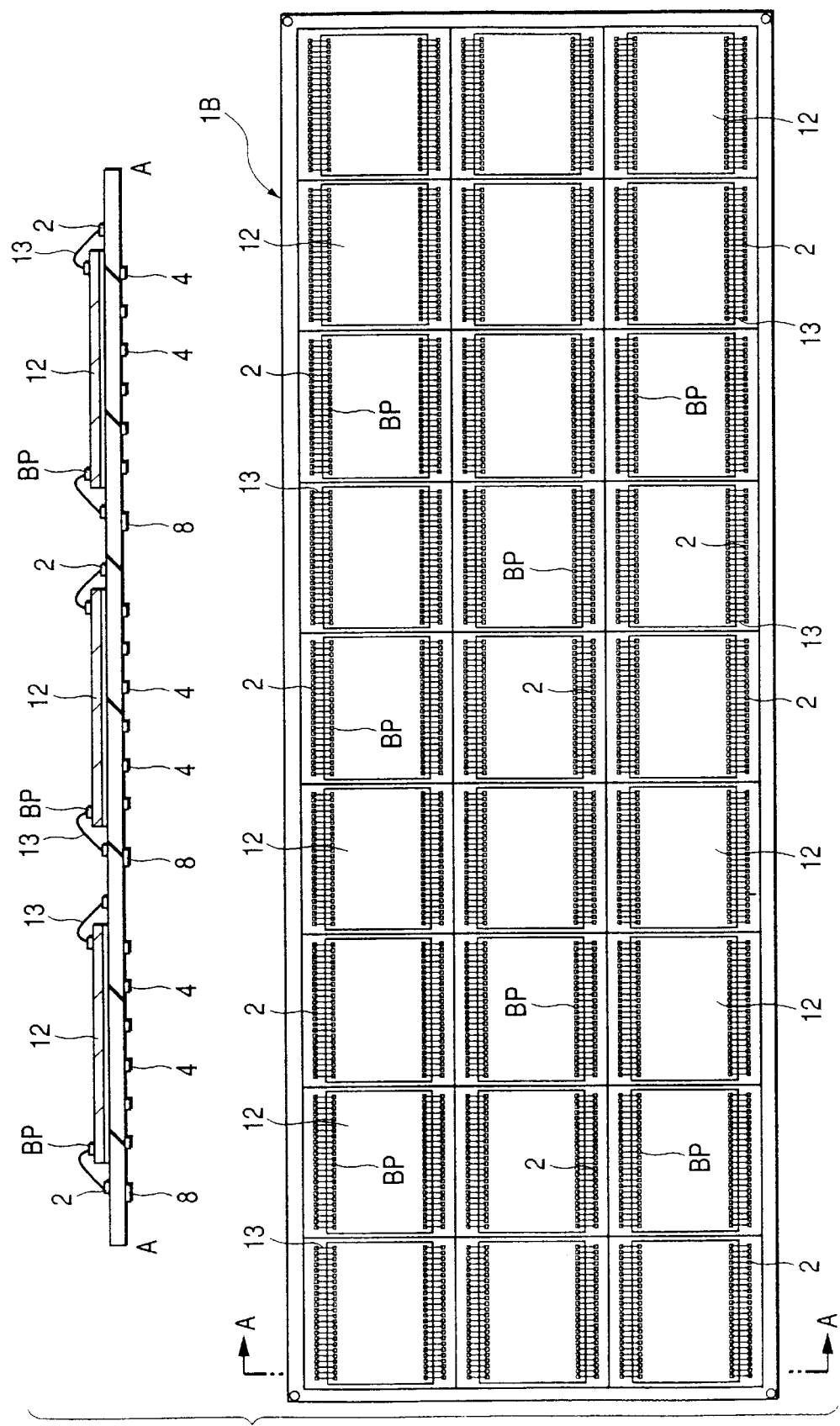
FIG. 9 is a plan view and brief cross-sectional view of the matrix substrate showing the manufacturing method of resin-molded semiconductor devices based on embodiment 1 of this invention.

Next, as shown in FIG. 9, the pads 2 on the matrix substrate 1B and the bonding pads BP on the chip 12 are connected electrically with wires 13. The wires 13 are gold (Au) wires for example. A known wire bonding machine which is based on heat-pressing and ultrasonic vibration is used for the connection of wires 13.

Figure 10:
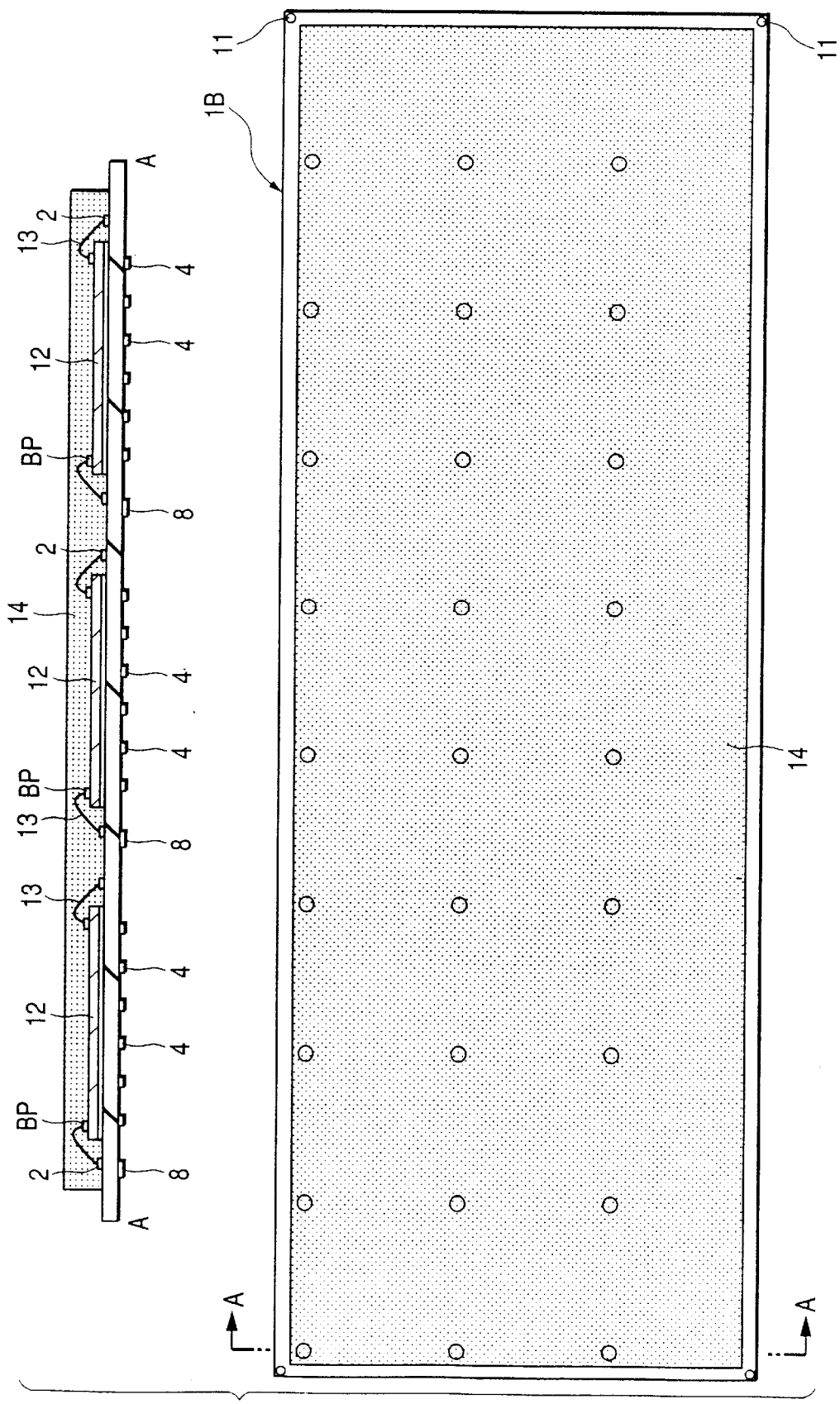
FIG. 10 is a plan view and brief cross-sectional view of the matrix substrate showing the manufacturing method of resin-molded semiconductor devices based on embodiment 1 of this invention.
Figure 11:
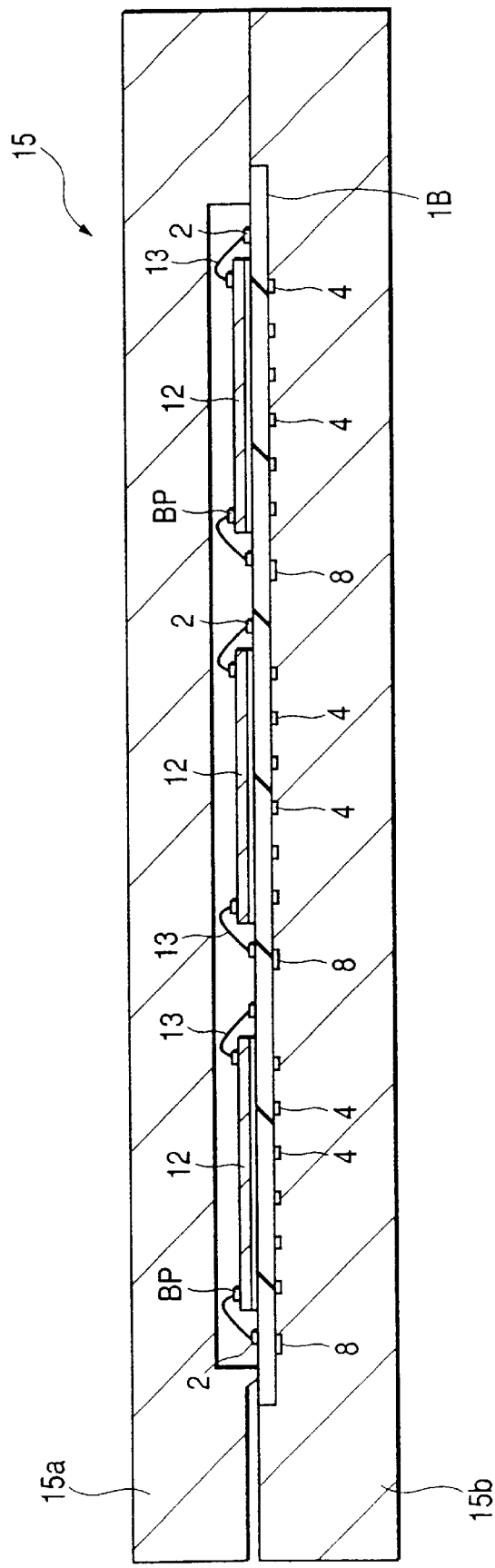
FIG. 11 is a brief cross-sectional view of the molding die showing the manufacturing method of resin-molded semiconductor devices based on embodiment 1 of this invention.

Next, as shown in FIG. 10, all chips 12 on the matrix substrate 1B are molded at once (block molding) with resin 14. Specifically, the matrix substrate 1B is loaded into the die 15 of the molding machine as shown in FIG. 11, with the guide holes 11 formed at the corners of the matrix substrate 1B (refer to FIG. 6 and FIG. 7) being coupled with the pins (not shown) of the die 15 so that the substrate 1B is positioned accurately, and resin is fed into the space (cavity) between the upper section 15a and lower section 15b of the die 15. The resin 14 used for this molding process is known epoxy resin which contains silica for example. The molding machine used in this process is a known machine which is used generally for the manufacturing of QFP (Quad Flat Package) and wafer level CSP (Chip Size Package) for example.

Figure 12:
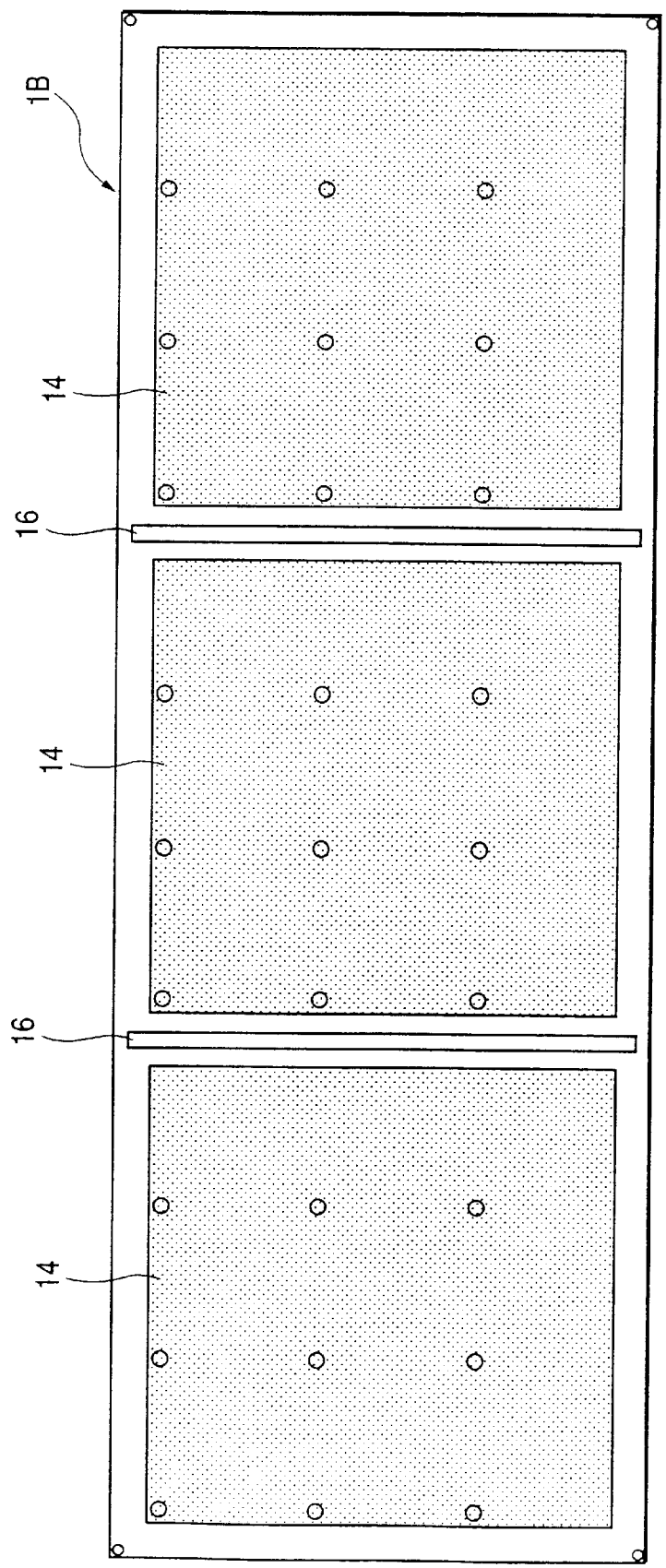
FIG. 12 is a plan view of the matrix substrate (upper side) showing the manufacturing method of resin-molded semiconductor devices based on embodiment 1 of this invention.

Due to the larger size of the matrix substrate 1B as compared with usual resin-molded semiconductor devices (e.g., QFP), the contraction of the resin mold 14 following the block molding of all chips 12 on the matrix substrate 1B can cause it to warp, resulting possibly in the difficulty of connection between pads 4 and solder bumps in the ball bonding process which will be explained later. Therefore, if this event is probable, it is desirable to prevent the warping of matrix substrate 1B by using a molding die having multiple cavities thereby to split the substrate 1B into multiple blocks, or forming slits 16 in the matrix substrate 1B as shown in FIG. 12.

Figure 13:
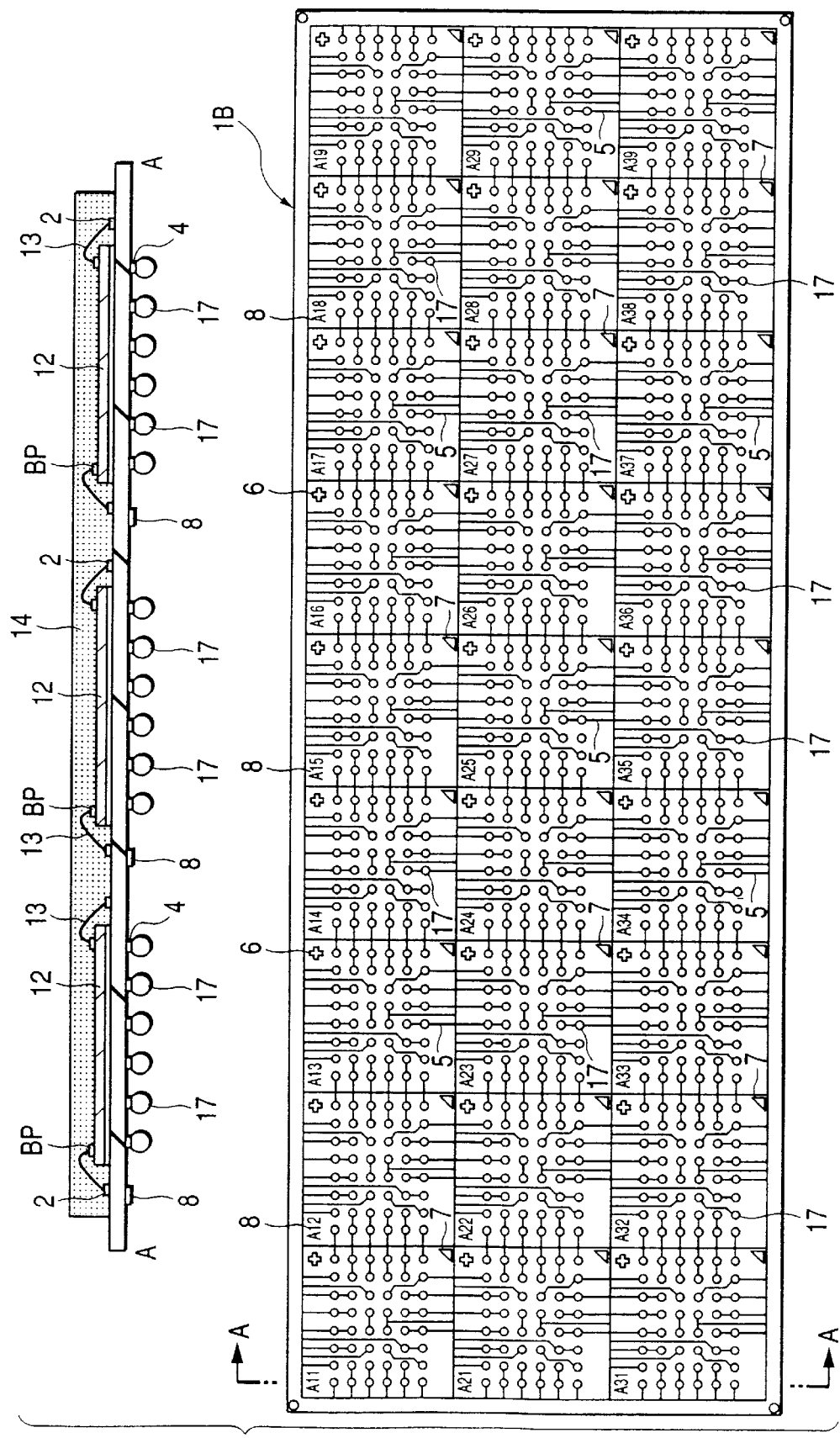
FIG. 13 is a plan view and brief cross-sectional view of the matrix substrate showing the manufacturing method of resin-molded semiconductor devices based on embodiment 1 of this invention.

Next, as shown in FIG. 13, solder bumps 17 are connected to the pads 4 which are formed on the rear side of the matrix substrate 1B. The solder bump 17 is made from known Sn-Pb eutectic alloy solder or the like for example. Specifically, solder balls are loaded to a known ball bonding tool which is used generally for the manufacturing of BGA (Ball Grid Array) for example, these solder balls are put on all pads 4 of the matrix substrate 1B at once, and the substrate 1B is heated in the oven to cause the solder balls to reflow. At connection of solder balls to the pads 4, the matrix substrate 1B is positioned accurately based on the observation of the alignment target 6 with a camera or the like.

Figure 14:
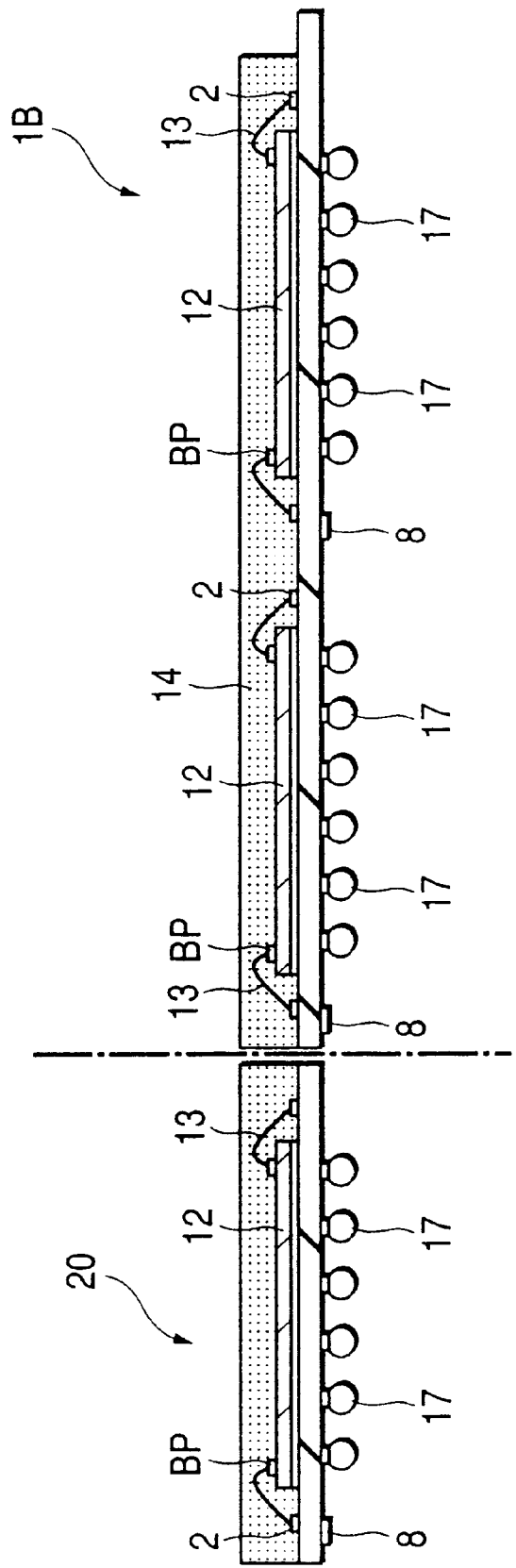
FIG. 14 is a brief cross-sectional view of the matrix substrate showing the manufacturing method of resin-molded semiconductor devices based on embodiment 1 of this invention.
Figure 15:
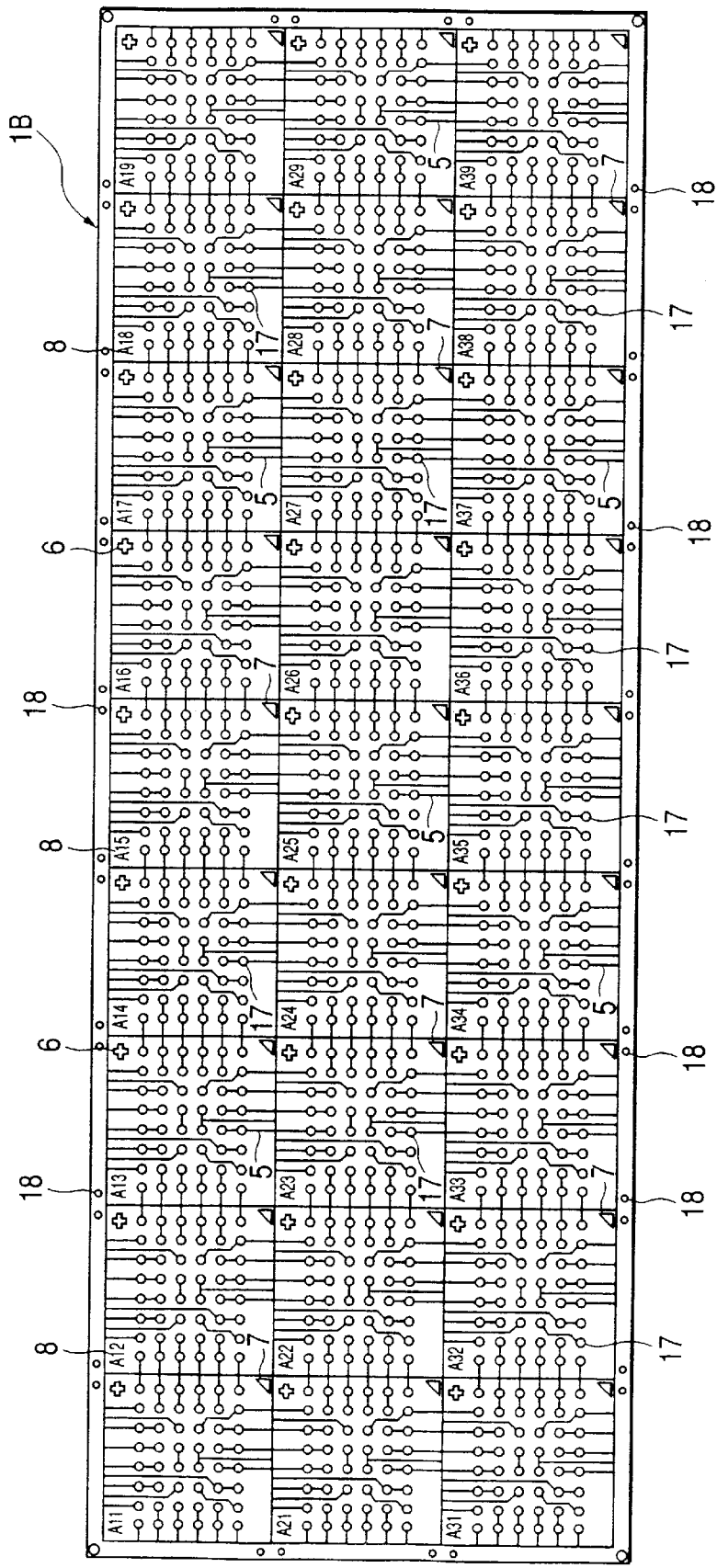
FIG. 15 is a plan view of the matrix substrate (rear side) showing the manufacturing method of resin-molded semiconductor devices based on embodiment 1 of this invention.

Next, as shown in FIG. 14, the matrix substrate 1B which is covered on the upper side with the resin mold 14 is cut into pieces to get BGA-type resin-molded semiconductor devices 20. A known dicing machine (dicer) which is used generally for cutting resin circuit boards, for example, with a dicing blade of around 200 $\mu$m in width being attached, is used for this dicing process. By the formation of alignment targets 18 for dicing on the rear side of the matrix substrate 1B as shown in FIG. 15, semiconductor devices can be cut out to have more accurate dimensions. The alignment targets 18 are formed of the material of wire patterns (copper), for example, together with other alignment targets 3 and 6.

Figure 16A:
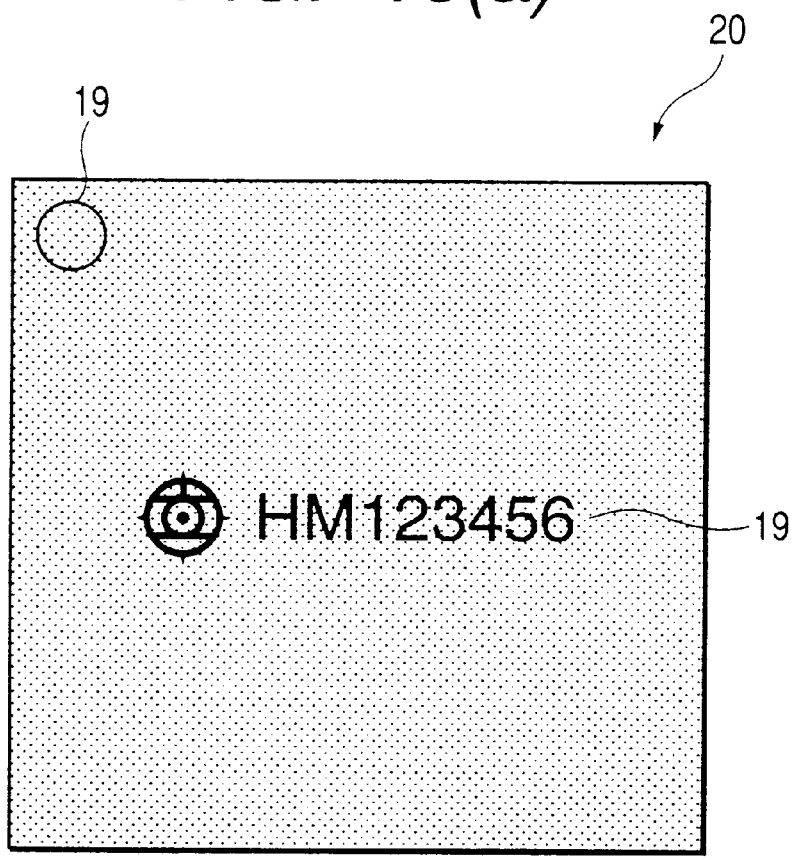
FIGS. 16(a) and 16(b) are a plan view and brief cross-sectional view, respectively, of the resin-molded semiconductor device.
Figure 16B:
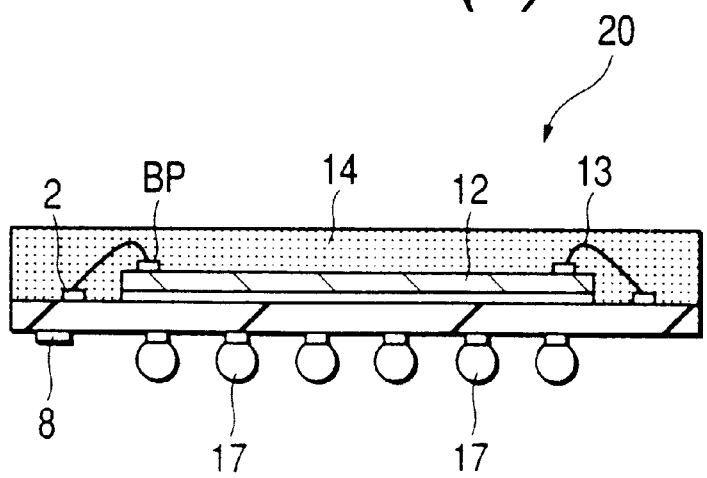

The resin-molded semiconductor devices 20 resulting from the dicing of the matrix substrate 1B undergo the selection test with testers, and a mark 19 of the product type, lot number, etc. (including the index mark of the upper side) is printed on the surface of the resin mold 14 as shown in FIG. 16. This marking is based on the known laser printing or ink printing.

The resin-molded semiconductor devices 20 undergo the selection test with testers and visual inspection, and selected good products are packed and shipped to the client manufacturer, where these parts will be packaged on circuit boards of various electronic appliances. At the mounting of a resin-molded semiconductor device 20 on a circuit board, it is positioned accurately based on the observation of the index pattern 7 formed on its packaging surface with a camera or the like.

Figure 18:
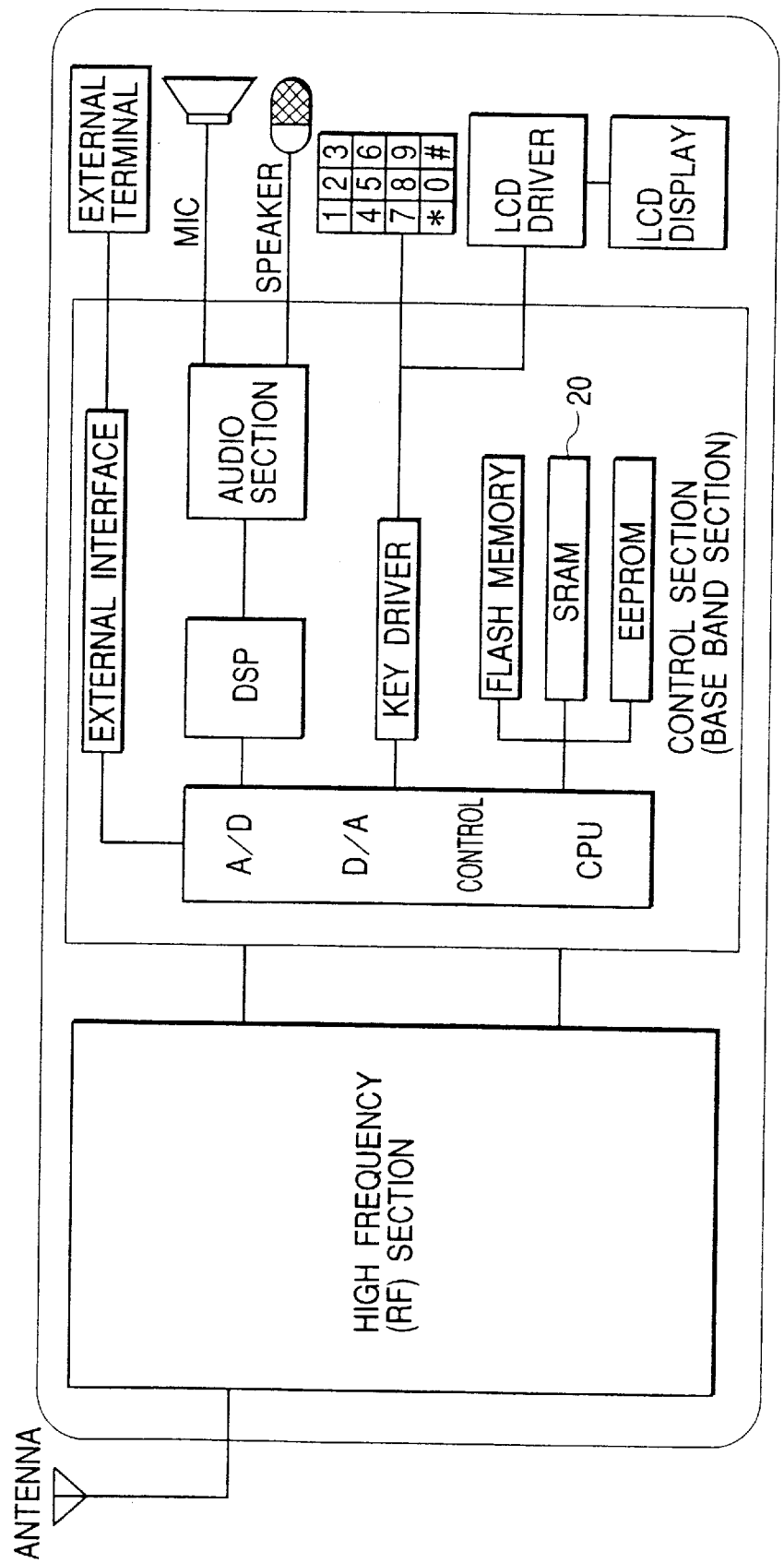
FIG. 18 is a functional block diagram showing an example of electronic appliance which incorporates the inventive resin-molded semiconductor device.

FIG. 17 shows by flowchart the semiconductor device manufacturing processes explained above. FIG. 18 shows by functional block diagram an electronic appliance, i.e., portable telephone set, which incorporates the resin-molded semiconductor device 20 explained above.

According to the manufacturing method of the foregoing embodiment, it is readily possible, even after the dicing of matrix substrate 1A, to find out the position of each finished resin-molded semiconductor device 20 in its former state on the matrix substrate 1A based on the observation with a camera, microscope, or human eyes of the address information pattern 8 which has been formed on the matrix substrate 1A, whereby the analysis of faulty products resulting from a process and finding of the defective position can be done promptly.

Embodiment 2

The address information patterns 8, which are formed by use of the wiring material on the packaging surface of the matrix substrate 1A in the preceding embodiment 1, can be formed in a different manner as follows.

Figure 19:
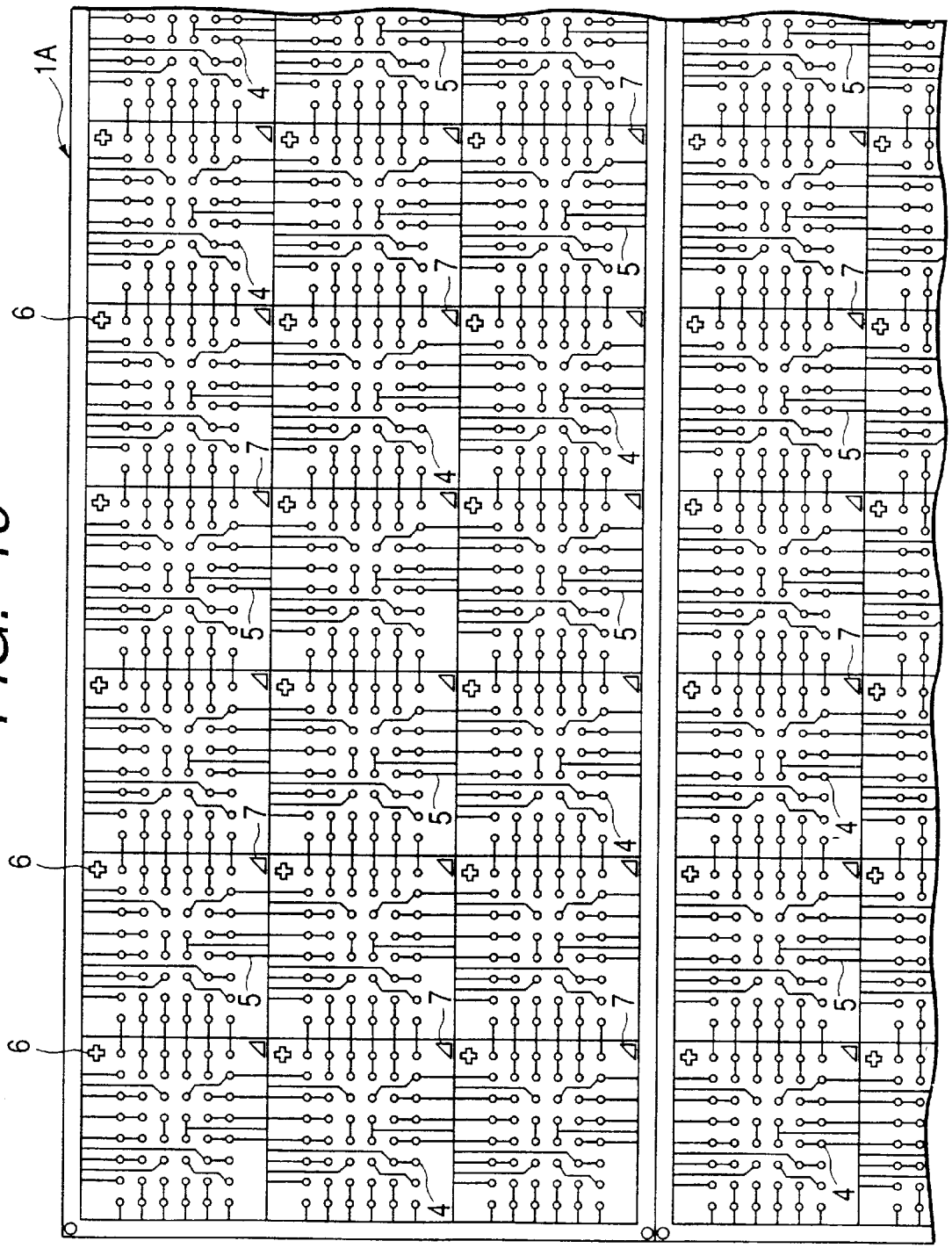
FIG. 19 is an enlarged plan view showing part of the matrix substrate (rear side) used for the manufacturing of resin-molded semiconductor devices based on embodiment 2 of this invention.

Initially, a matrix substrate 1A as shown in FIG. 19 is prepared. This matrix substrate 1A has the same structure as the matrix substrate 1A of the preceding embodiment 1 except that it does not have the address information patterns 8.

Figure 20:
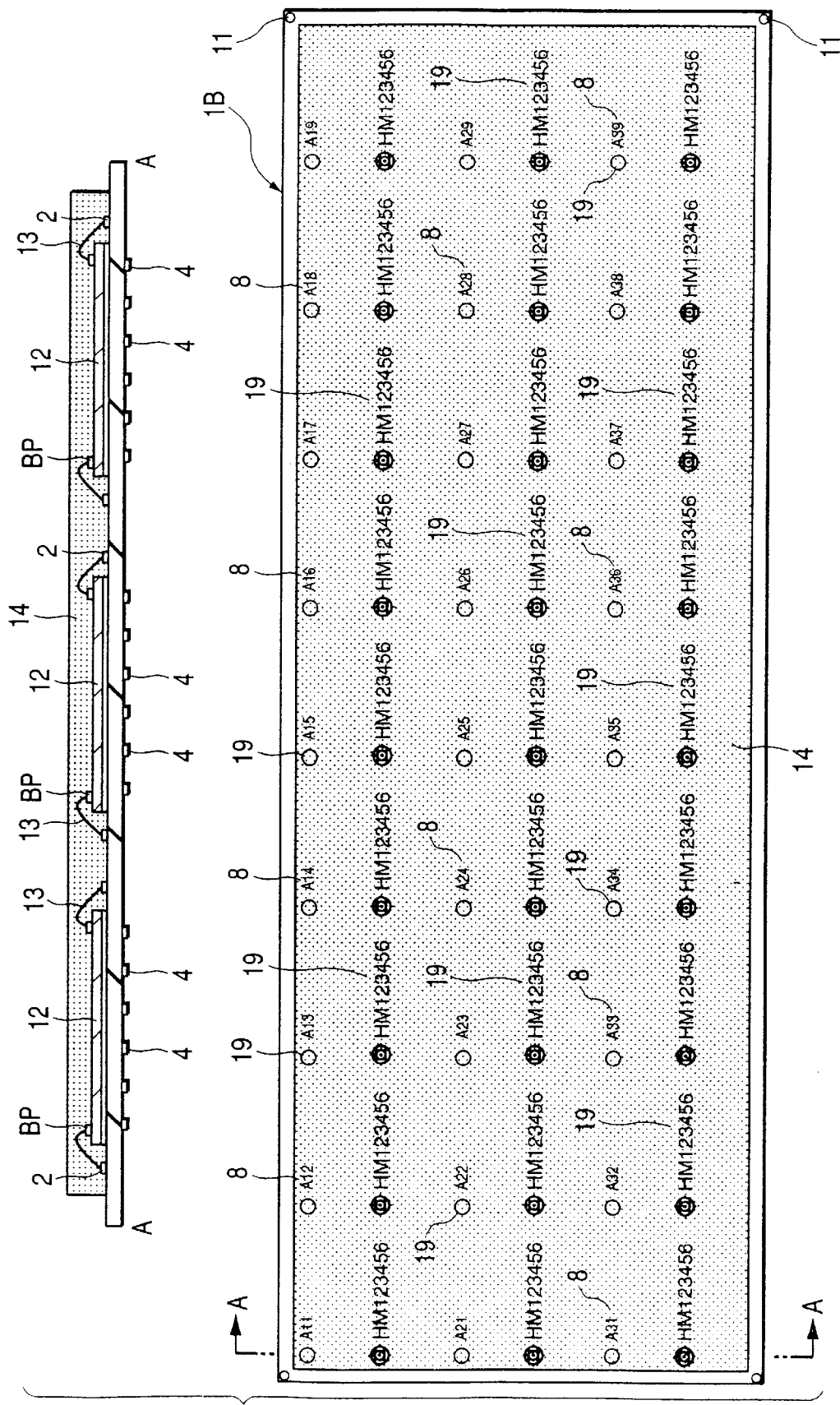
FIG. 20 is a plan view and brief cross-sectional view of the matrix substrate showing the manufacturing method of resin-molded semiconductor devices based on embodiment 2 of this invention.

Next, the processing steps of the preceding embodiment 1 shown in FIG. 6 through FIG. 11 are followed to implement the cutting out of matrix substrates 1B for molding, bonding of wires 13, and block molding of chips 12 with the resin mold 14. Finally, marks 19 of the product type, lot number, etc. are printed on the surface of the resin mold 14, and, at the same time in this embodiment, address information patterns 8 are printed on the surface of the resin mold 14 as shown in FIG. 20. The marks 19 and address information patterns 8 are printed based on the known laser printing or ink printing. The marks 19 are the same pattern for all areas of resin-molded semiconductor devices, while the address information patterns 8 are different for individual areas.

Figure 21A:
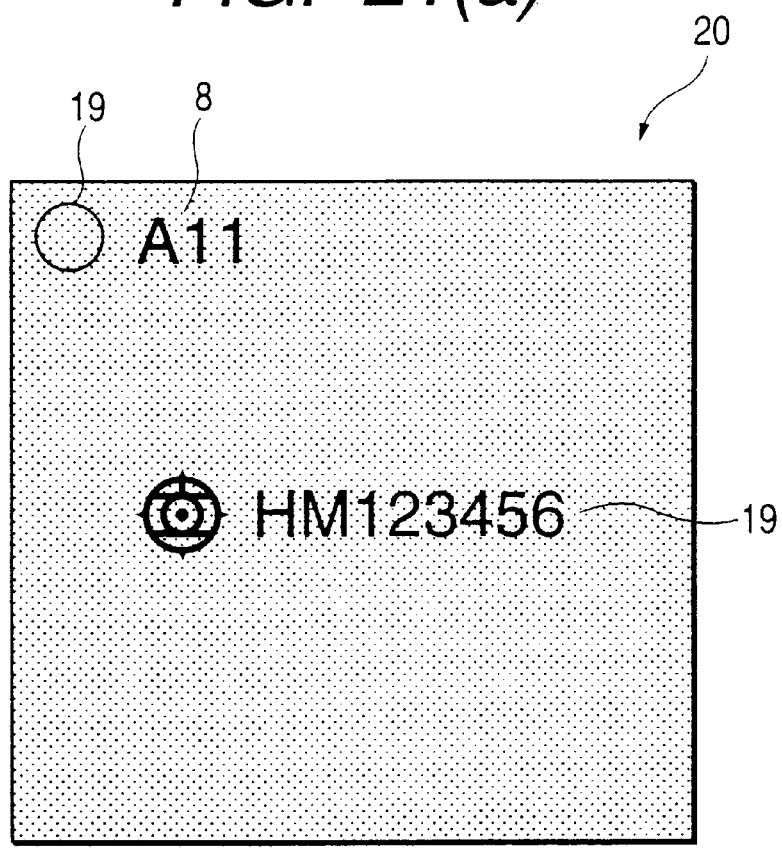
FIGS. 21(a) and 21(b) are a plan view and brief cross-sectional view, respectively, of the resin-molded semiconductor device.
Figure 21B:
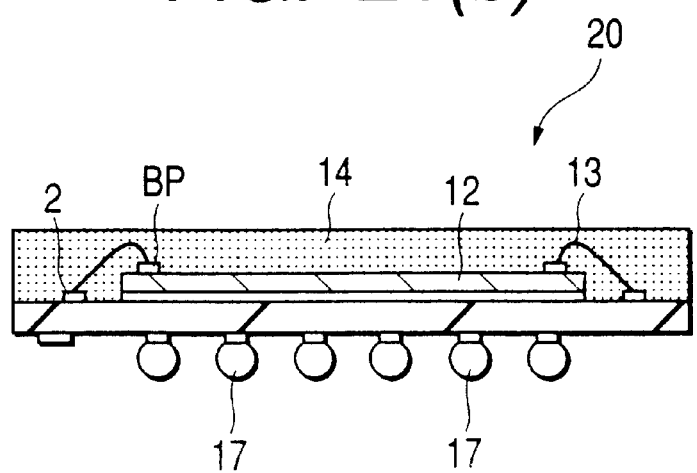
Figure 22:
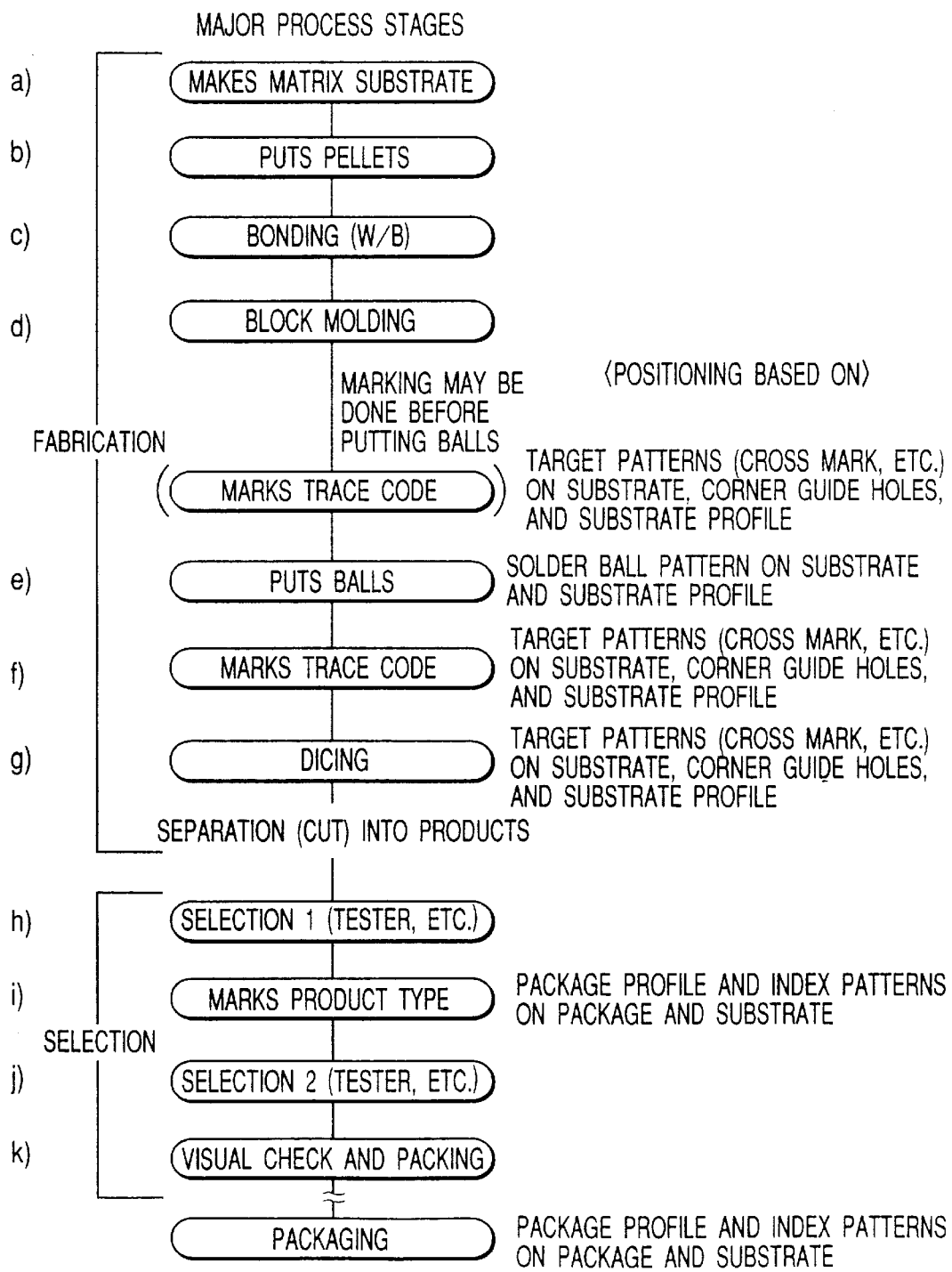
FIG. 22 is a flowchart showing the manufacturing method of resin-molded semiconductor devices based on embodiment 2 of this invention.

Next, the processing steps of the preceding embodiment 1 shown in FIG. 13 and FIG. 14 are followed to implement the connection of the solder bumps 17 and dicing of the matrix substrate 1B, thereby completing a resin-molded semiconductor device 20 as shown in FIG. 21. Printing of the mark 19 and address information pattern 8 on the surface of the resin mold 14 may be implemented after the connection of the solder bumps 17. The resin-molded semiconductor devices 20 undergo the selection test with testers and visual inspection, and selected good products are packed and shipped to the client manufacturer, where these parts will be packaged on circuit boards of various electronic appliances. FIG. 22 shows by flowchart the above-mentioned manufacturing processes.

The present invention has been explained for its specific embodiments, however, the invention is not confined to these embodiments, but can be altered obviously in various ways without departing from the essence of the invention.

The present invention is not confined to resin-molded semiconductor devices of the BGA type, but is applicable to various resin-molded semiconductor devices, such as TSOJ, LGA and mini-card, having external connecting terminals other than the solder bumps. Semiconductor chips are not confined to SRAM, but various memory LSI chips such as of DRAM and flash memory can be used.

The effectiveness achieved by the representative affairs of invention disclosed in this specification is summarized as follows.

Based on the present invention for the manufacturing of resin-molded semiconductor devices, in which multiple semiconductor chips which are mounted on a wiring substrate are processed for block molding and thereafter the wiring substrate is diced into multiple semiconductor devices, it becomes possible, even after the dicing process, to find out the position of each finished resin-molded semiconductor device in its former state on the wiring substrate, whereby the analysis of faulty products resulting from a process and finding of the defective position can be done promptly.

The inventive technique is applicable also to the case of using standard (existing) molding dies of clients, whereby the manufacturing cost of resin-molded semiconductor devices can be reduced.

What is claimed is:

1. A method of manufacturing a semiconductor device including processing steps of implementing the block molding with resin for a plurality of semiconductor chips which are mounted on a wiring substrate and thereafter dicing the wiring substrate into a plurality of resin-molded semiconductor devices, wherein said method further includes a step, which precedes said substrate dicing step, of appending address information to each of the resin-molded semiconductor devices.

2. A method of manufacturing a semiconductor device according to claim 1, wherein said address information includes information indicative of the position of each of the resin-molded semiconductor devices within the wiring substrate.

3. A method of manufacturing a semiconductor device including processing steps of implementing the block molding with resin for a plurality of semiconductor chips which are mounted on a wiring substrate and thereafter dicing the wiring substrate into a plurality of resin-molded semiconductor devices, wherein said method further includes a step, which precedes said substrate dicing step, of appending address information of each of the resin-molded semiconductor devices to part of the wiring substrate.

4. A method of manufacturing a semiconductor device according to claim 3, wherein said address information is shaped in a wiring material which has been formed in a step of forming wire patterns on the wiring substrate.

5. A method of manufacturing a semiconductor device according to claim 4, wherein said address information also has the role of index information which orients the resin-molded semiconductor device on a circuit board at packaging.

6. A method of manufacturing a semiconductor device according to claim 4, wherein said address information is shaped at a position different from the position of index information which orients the resin-molded semiconductor device on a circuit board at packaging.

7. A method of manufacturing a semiconductor device including processing steps of implementing the block molding with resin for a plurality of semiconductor chips which are mounted on a wiring substrate and thereafter dicing the wiring substrate into a plurality of resin-molded semiconductor devices, wherein said method further includes a step, which precedes said substrate dicing step that follows the block molding with resin of said semiconductor chips, of appending address information to each of the resin-molded semiconductor devices.

8. A method of manufacturing a semiconductor device according to claim 7, wherein said address information is shaped in a step of printing a mark on the surface of the resin mold.

9. A method of manufacturing a semiconductor device according to claim 8, wherein said address information and said mark are printed based on a laser printing scheme.

10. A method of manufacturing a semiconductor device according to claim 7, wherein said address information is shaped in a step different from a step of printing the mark on the resin mold.

\* \* \* \* \*